United States Patent

Yoshida et al.

[11] Patent Number: 5,784,778
[45] Date of Patent: Jul. 28, 1998

[54] COMPONENT MOUNTING APPARATUS AND COMPONENT MOUNTING METHOD

[75] Inventors: Yoshihiro Yoshida, Yao; Noriaki Yoshida, Ikeda; Takeshi Takeda, Osaka; Kanji Hata, Katano, all of Japan

[73] Assignee: Matsushita Electric Industrial Co., Ltd., Osaka, Japan

[21] Appl. No.: 587,462

[22] Filed: Jan. 17, 1996

[30] Foreign Application Priority Data

Jan. 17, 1995 [JP] Japan .................. 7-004786

[51] Int. Cl.⁶ .................. H05K 3/30; B23P 19/00
[52] U.S. Cl. .................. 29/834; 29/832; 29/740; 29/743
[58] Field of Search .................. 29/740, 741, 743, 29/832, 837, 840, 834; 228/180.1; 294/2, 64.1; 414/737

[56] References Cited

U.S. PATENT DOCUMENTS 4,905,370  3/1990  Hineno et al. .................. 29/743
4,951,388  8/1990  Eguchi et al. .................. 29/832
5,544,411  8/1996  Kano et al. .................. 29/743

FOREIGN PATENT DOCUMENTS 0 401 808  12/1990  European Pat. Off. .
1-107600  4/1989  Japan .

Primary Examiner—P. W. Echols
Attorney, Agent, or Firm—Wenderoth, Lind & Ponack

[57] ABSTRACT

A rotary body rotatable about a vertical axis thereof is set at a mounting head. A cam having a cam surface at a lower end thereof is arranged along the periphery of a lower part of the rotary body. Each of outer cylinders is rotatably set in the periphery of the rotary body, wherein each of nozzle shafts with each suction nozzle fitted at lower ends thereof penetrates each outer cylinder in a freely movable manner in an up and down direction. An engaging part for a rotary device is provided at an upper end of each outer cylinder, and an engaging device for the cam is placed at a lower part of each nozzle shaft projecting from a lower end of each outer cylinder.

19 Claims, 7 Drawing Sheets

COMPONENT MOUNTING APPARATUS AND COMPONENT MOUNTING METHOD

BACKGROUND OF THE INVENTION

The present invention relates to an apparatus for suctioning leadless electronic component or the like component and then mounting the suctioned component at a predetermined position of a printed board, etc. and to a component mounting method for suctioning the component and mounting it on the board by using the apparatus.

CONVENTIONAL ART

As leadless electronic components (chip components) have been common and diversified in shape and size in recent years, a component mounting apparatus designed to mount electronic components in combination with each other to constitute an electronic circuit is required to operate at a high speed with higher reliability. At the same time, suction nozzles of the component mounting apparatus should be selectable in conformity to various kinds of shapes and sizes of the electronic component.

Japanese Patent Laid-Open Publication No. 1-107600 (107600/1989) discloses a component mounting apparatus to fulfill the aforementioned requirements that comprises a component feeding section for feeding component, an X-Y table section which can hold and position a substrate at a predetermined position, a rotary frame rotatable between the component feeding section and the X-Y table section, and mounting heads/having a plurality of suction nozzles in correspondence to different kinds of component, and arranged at equal distances along the periphery of the rotary frame. A mounting head 40 has, as is shown in FIG. 8, a cam cylinder body 42 fixed at a lower end of a rotatable supporting shaft 41. An axis of the cam cylinder body 42 is arranged eccentric to an axis of the supporting shaft 41. A grooved cam 43 is formed in a circumferential wall of the cam cylinder body 42. A rotary body 44 is set in the cam cylinder body 42 in a rotatable fashion. Moreover, a plurality of kinds of suction nozzles 46 for suctioning a component 45 are disposed in an outer peripheral part of the rotary body 44 so as to be able to to project retreat in a direction of an axis thereof. The axis of each suction nozzle is to agree with the axis of the rotary supporting shaft 41. An engaging member 47 is set to each suction nozzle 46 to be engaged with the grooved cam 43. The rotary body 44 is rotated by a rotating device 48, while the rotary supporting shaft 41 is driven by a rotating device 49.

In the above-described structure, when the rotary body 44 is rotated by the rotating device 48, as the grooved cam 43 is engaged with the engaging member 47, the suction nozzle 46 which is moved to a position where it agrees with the rotary supporting shaft 41 is pushed downward and hence selected.

A longitudinal groove 50 is formed at part of the grooved cam 43 so as to let the suction nozzle 46 retreat to absorb shocks when the component is mounted. A slider 51 set in the longitudinal groove 50 is urged elastically by a spring 52 and engaged with the engaging member 47.

In the conventional art as above, when it becomes necessary to rotate the suction nozzle 46 to adjust a rotating posture of the component 45 suctioned and held by the suction nozzle, the rotary supporting shaft 41 is rotated about the axis to thereby rotate the whole mounting head 40. In other words, rotating the entire large mass of the mounting head 40 hinders the apparatus from operating at high velocity. Moreover, the slider 51 is moved against the elastic urging force of the spring via the engaging member 47 projecting sideways to retreat the suction nozzle 46, which increases a resistance during mounting, i.e., when the suction nozzle ought to be moved upward, resulting in poor shock-absorbing properties.

SUMMARY OF THE INVENTION

An object of the present invention is to provide a component mounting apparatus wherein only one nozzle shaft can be selected from the nozzle shafts at an operating position and a position of the suctioned component can be corrected at high speed.

Another object of the present invention is to provide a component mounting method using the mounting apparatus wherein only one nozzle shaft can be selected from the nozzle shafts at the operating position and a position of the suctioned component can be corrected at high speed.

In accomplishing these and other aspects, according to one aspect of the present invention, there is provided a component mounting apparatus wherein a mounting head having a plurality of suction nozzles for suctioning components is set on a moving body movable between a component feeding station and a component mounting station. The component mounting apparatus comprises a rotary body fitted in the mounting head in a rotatable fashion about an axis thereof;

A cam is fixed to the mounting head and has an annular cam surface arranged along a periphery of the rotary body so as not to rotate in connection with the rotary body.

Nozzle shafts are arranged along the periphery of the rotary body, each of which has a respective suction nozzle at its lower end.

Outer cylinders in each of which each of the nozzle shafts located therein in a freely movable fashion in an up and down direction. They are respectively disposed along the periphery of the rotary body and elongate in an axial direction of the rotary body so as to be rotatable about their axis of each axes. Each outer cylinder has an engaging part at its upper end to be engaged with a rotary device for rotating each outer cylinder.

Engaging devices are formed in a rotatable fashion on each nozzle shaft and contacted with the cam surface of the cam to thereby move each nozzle shaft in correspondence with the cam surface.

When only one nozzle shaft of the nozzle shafts is located at an operating position of the rotary body according to rotation of the rotary body, the suction nozzle of the only one nozzle shaft is used for suctioned the component or mounting the suctioned component on a board.

According to another aspect of the present invention there is provided the component mounting apparatus, wherein the cam surface of the cam is designed to lower only one of the nozzle shafts to a position where the suction nozzle is prepared to suction the component at the operating position.

According to another aspect of the present invention, there is provided a component mounting method for mounting a component on a board by using a component mounting apparatus.

A mounting head having a plurality of suction nozzles for suctioning components is set on a moving body movable between a component feeding station and a component mounting station. The component mounting apparatus comprises a rotary body fitted in the mounting head in a rotatable fashion about an axis thereof.

A cam fixed to the mounting head and having an annular cam surface is arranged along a periphery of the rotary body in a manner so as not to rotate in connection with the rotary body.

Nozzle shafts are arranged along the periphery of the rotary body, each of which has a suction nozzle at its lower end.

Outer cylinders have respective nozzle shafts located therein a freely movable fashion in an up/down direction, and are respectively disposed along the periphery of the rotary body and elongate in an axial direction of the rotary body so as to be rotatable about axes. Each outer cylinder has an engaging part at its upper end to be engaged with a rotary device for rotating each outer cylinder.

Engaging devices are formed in a rotatable fashion at each nozzle shaft and contacted with the cam surface of the cam to thereby move each nozzle shaft in correspondence with the cam surface.

When only one nozzle shaft of the nozzle shafts is located at an operating position of the rotary body according to the rotation of the rotary body, the suction nozzle of the only one nozzle shaft is used for suctioned the component or mounting the suctioned component on a board, and the cam surface of the cam is designed to lower only one of the nozzle shafts to a position where the suction nozzle is prepared for a suction operation at the operating position of the suction nozzle.

The method comprises steps of: locating the only one nozzle shaft at the operating position and thus lowering the one nozzle shaft from the rotary body with the rest of the nozzle shafts not being lowered; moving the mounting head downward at the component feeding station; suctioning the component with the suction nozzle of the lowed nozzle shaft; correcting a position of the suctioned component by rotating the suction nozzle through rotation of the outer cylinder having the suction nozzle suctioning the component; and mounting the positionally corrected component on the board at the component mounting station.

These above and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
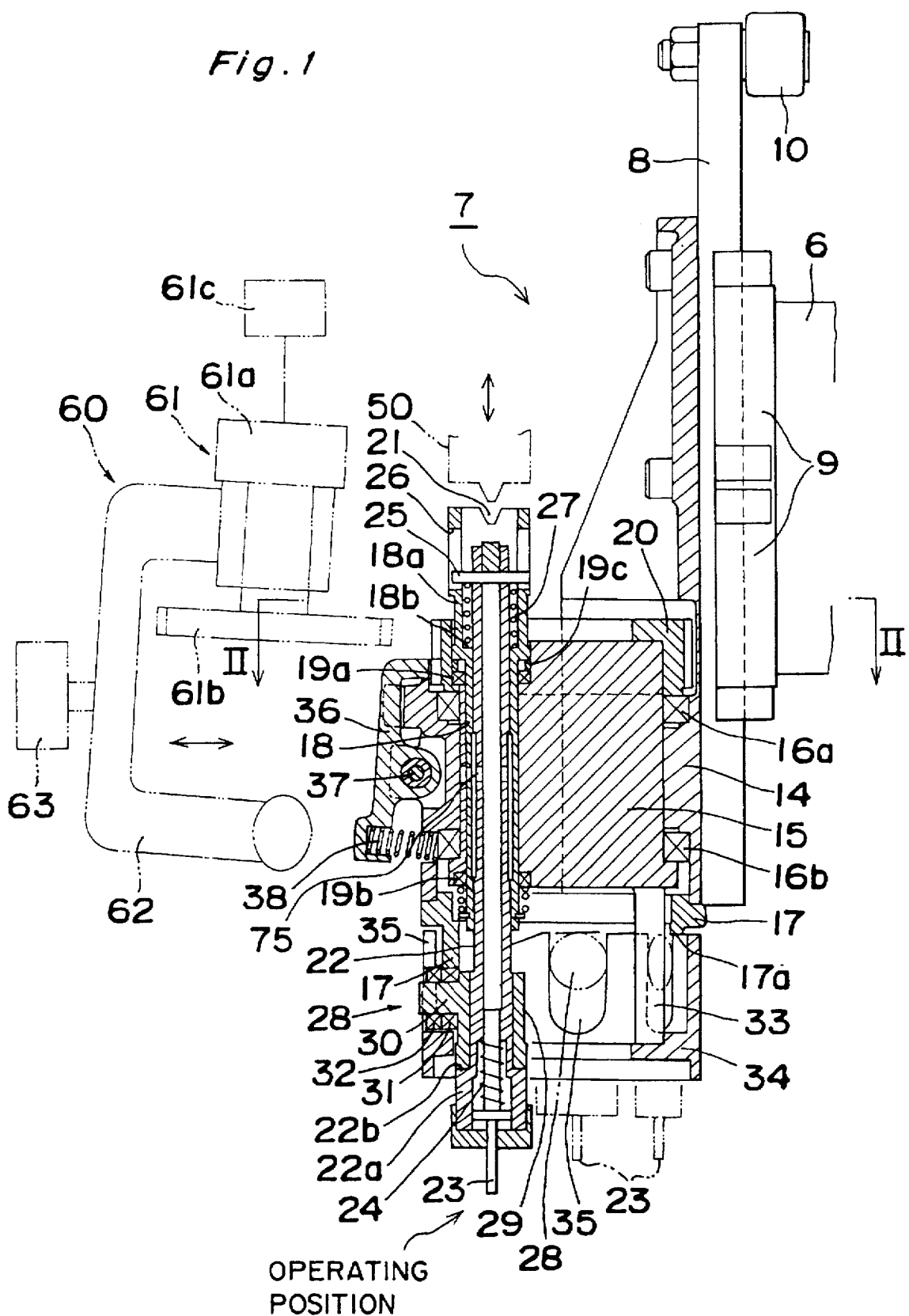
FIG. 1 is a longitudinal sectional view of a mounting head in a component mounting apparatus according to one embodiment of the present invention.

Before the description of the present invention proceeds, it is to be noted that like parts are designated by like reference numerals throughout the accompanying drawings.

Component mounting apparatuses according to embodiments of the present invention will be described with reference to FIGS. 1-7 hereinbelow.

Figure 4:
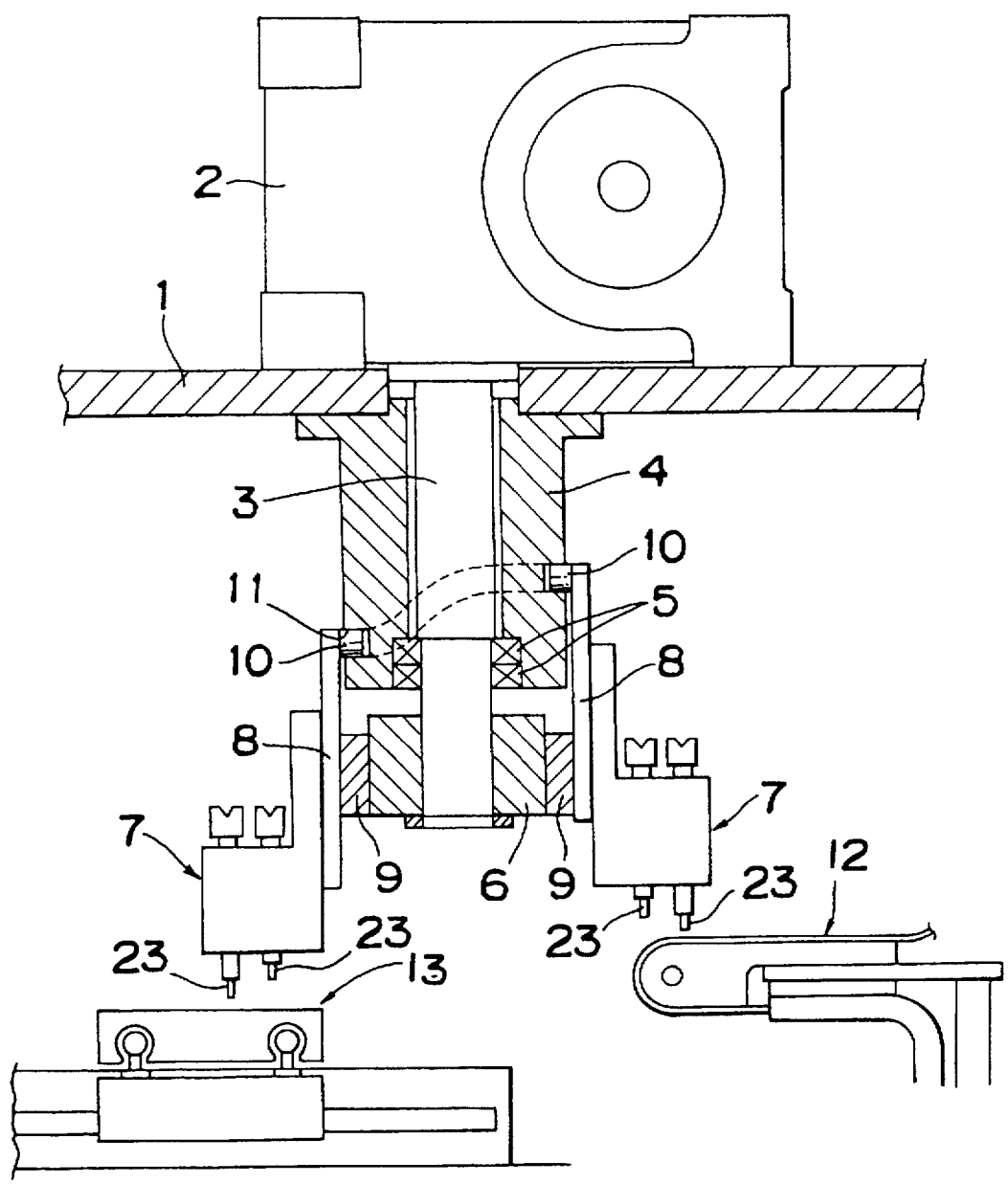
FIG. 4 is a longitudinal sectional view schematically showing the whole constitution of the component mounting apparatus in the embodiment.

Referring first to FIG. 4, the total constitution of the component mounting apparatus will be depicted. An intermittent rotating device 2 is set on a supporting base 1, having a rotary main shaft 3 projecting below the supporting substrate 1. The rotary main shaft 3 is rotatably supported via bearings 5 by a supporting cylindrical body 4 secured at a lower surface of the supporting substrate 1.

A rotary frame 6 is fixed at a lower end of the rotary main shaft 3. A plurality of mounting heads 7 are so arranged as to be movable up and down at an outer peripheral part of the rotary frame 6 with an angular pitch corresponding to a rotary angle for indexing of the rotating device 2.

A guide rod 8 linearly extending upward from each mounting head 7 is supported by a supporting block 9 fitted at the rotary frame 6. The guide rod 8 is freely movable in an up and down direction with respect to the supporting block 9. When the rotary main shaft 3 is rotated together with the rotary frame 6 and the supporting block 9, the mounting heads 7 and the guide rod 8 are rotated together with block 9. A cam follower 10 installed at an upper end of the guide rod 8 is engaged with a grooved cam 11, moving the mounting head 7 along the guide rod up and down the grooved cam 11 being formed at an outer peripheral surface of the supporting cylindrical body 4.

A component feeding station 12 and a component mounting station 13 are located at stop positions where the mounting heads 7 are stopped by the intermittent rotation of the rotary frame 6.

In accordance with the intermittent rotation of the rotary frame 6 by the rotating device 2, each of the mounting heads 7 is sequentially moved to each of the above stations, and set at height fit for the respective stations through the engagement of the grooved cam 11 and the cam follower 10 via the guide rod 8.

Although not shown in the drawings, each of the mounting heads 7 can be lowered a predetermined stroke to suction and mount the component at the component feeding station 12 and component mounting station 13.

Figure 2:
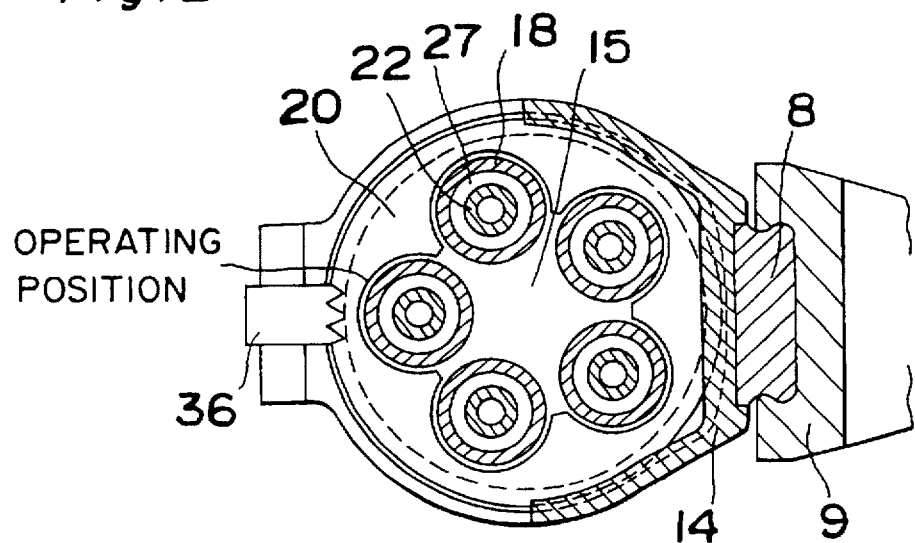
FIG. 2 is lateral sectional view of the mounting head taken along a line II—II of FIG. 1.
Figure 3:
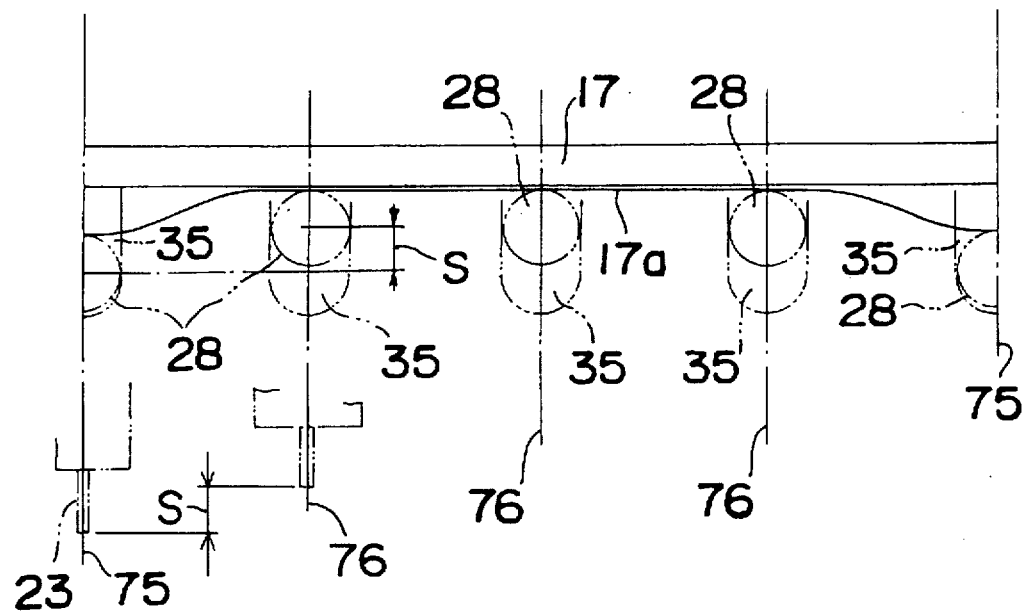
FIG. 3 is a developmental view of a cam in the embodiment.

The constitution of one of the mounting heads 7 will be discussed with reference to FIGS. 1-3. A cylindrical rotary body 15 is fitted inside a cylindrical head main body 14 in a manner to be rotatable around a vertical axis of the rotary body 15 via bearings 16a and 16b. A cam 17 having an annular cam surface 17a at a lower end thereof is installed at a lower end of the head main body 14 along the periphery of a lower part of the rotary body 15. A plurality of outer cylinders 18 penetrate a peripheral part of the rotary body 15 in the vertical direction. Each of the outer cylinders 18 is spaced at an equal distance along the same circumference of the rotary body 15 and is rotatably supported via bearings 19a and 19b. In order to prevent an unnecessary rotation of each outer cylinder 18, each of brake shoes 19c is installed adjacent to each of bearings 19a so as to bring each brake shoe 19c into contact with each outer cylinder 18. A gear 20 is fixed at an outer periphery of an upper end of the rotary body 15.

An engaging part 21 of a V-shaped groove for engaging a rotary device 50 such as a motor is formed at an upper end of each outer cylinder 18. The rotary device 50 moves upward and downward relative to the engaging part 21 for engaging with or disengaging from the engaging part 21, and rotates each outer cylinder 18 by means of engaging the rotary device 50 with the engaging part 21. Each of nozzle shafts 22 is passed through each outer cylinder 18, respectively, to be movable up and down therein. A suction nozzle 23 (—and after "kind"—of component) corresponding to every different kind is fitted at a lower end of each nozzle shaft 22, which is movable up and down within a predetermined range. A spring 24 serves as one example of an urging member and is installed at each suction nozzle 23 in each nozzle shaft 22. Each spring 24 urges each suction nozzle 23 to project each suction nozzle 23 from each nozzle shaft 22 in a manner to allow the suction nozzle to retract.

An engaging pin 25 at an upper end of each of the nozzle shafts 22 penetrates the nozzle shaft 22 in its diametrical direction and has both end parts thereof engaged with an engaging groove 26 formed in an axial direction of each outer cylinder 18 at an upper large-diameter part 18a of each outer cylinder 18. A spring 27 for urging each of the nozzle shafts 22 upward is interposed between an inner circumferential step surface 18b of the part 18a and the engaging pin 25.

In the meantime, a lower large-diameter part 22a is formed at a lower end part of each of the nozzle shafts 22 projecting from a lower end of each of the outer cylinders 18. An engaging device 28 is provided with each of the nozzle shafts 22. Each engaging device 28 for the cam 17 is fitted on an outer circumferential step surface 22b of each nozzle shaft 22. As indicated in FIG. 3, the cam surface 17a of the cam 17 is so formed as to forcibly drop the engaging device 28 by a predetermined stroke S against the urging force of the spring 27 at a single predetermined operating position 75. Only the suction nozzle 23 of the nozzle shaft 22 located at the operating position 75 can suction the component and mount the suctioned component on the board. The only suction nozzle 22 located at the operating position can connect with a suction path from a suction device.

When each of the nozzle shafts 22 is rotated via each of the outer cylinders 18 by rotating the rotary body 15, each of the nozzle shafts 22 is moved up and down by the cam surface 17a of the cam 17. When the single nozzle shaft 22 to be selected comes to the operating position 75, the selected nozzle shaft 22 is set to be lower than the rest of the nozzle shafts 22 at other rotating positions, namely non-operating positions 76, than the operating position 75.

Each of the engaging devices 28 comprises a cylindrical body 29 outfitted with each nozzle shaft 22 and a cam follower 30 projecting at one side of the cylindrical body 29. The cylindrical body 29 is outfitted with each of the nozzle shafts 22 in an engaging state so as not to be relatively rotatable due to a frictional force and to be relatively rotatable when a fixed or greater amount of external force acts on the nozzle shaft 22. Therefore, each of the nozzle shafts 22 can be forcibly rotated to an optional rotating position via the engaging pin 25 engaged with the engaging groove 26 through the rotation of the outer cylinder 18 rotated by the rotary device 50.

Figure 5:
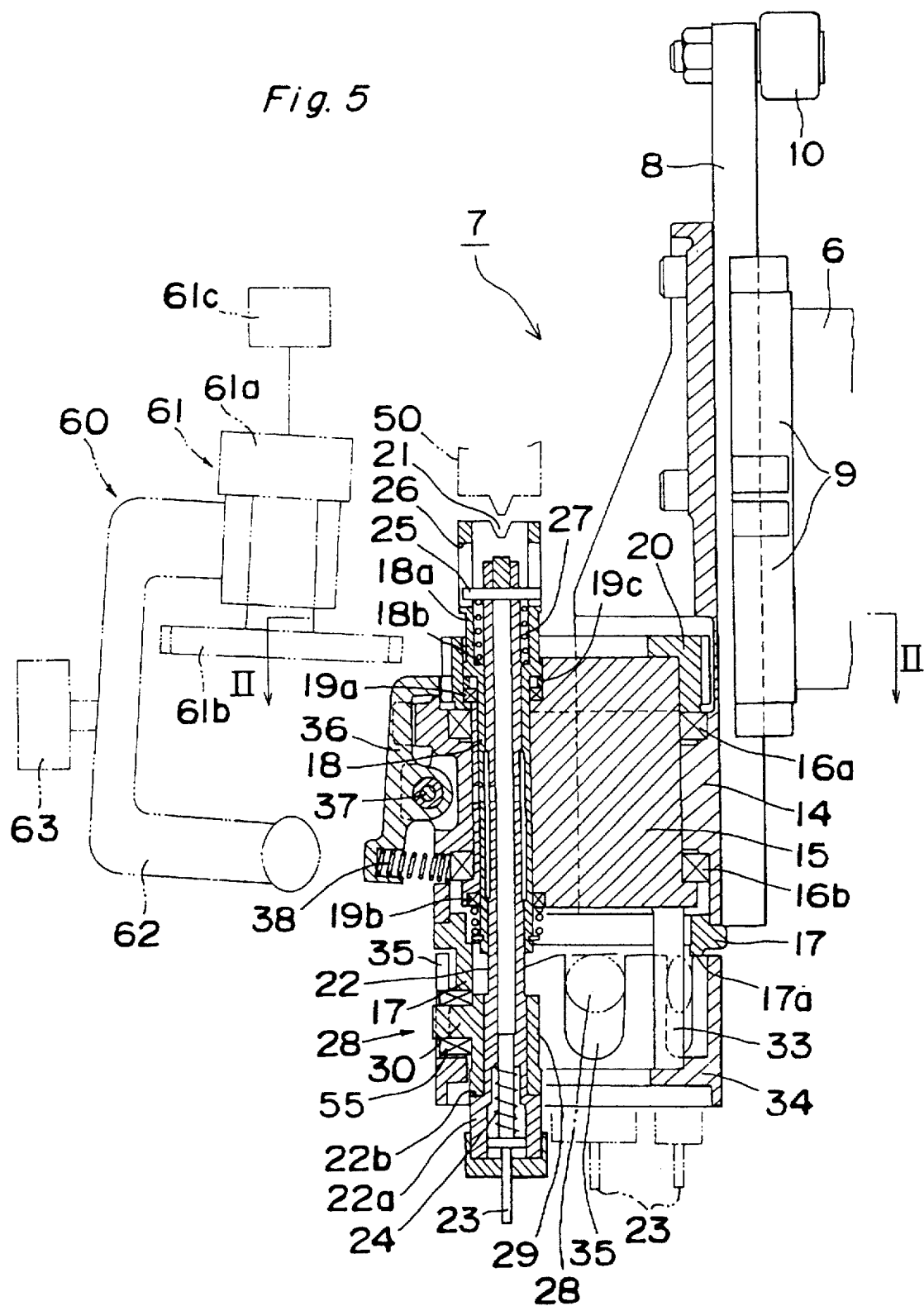
FIG. 5 is a view of an engaging device of FIG. 1 in a different embodiment.
Figure 6:
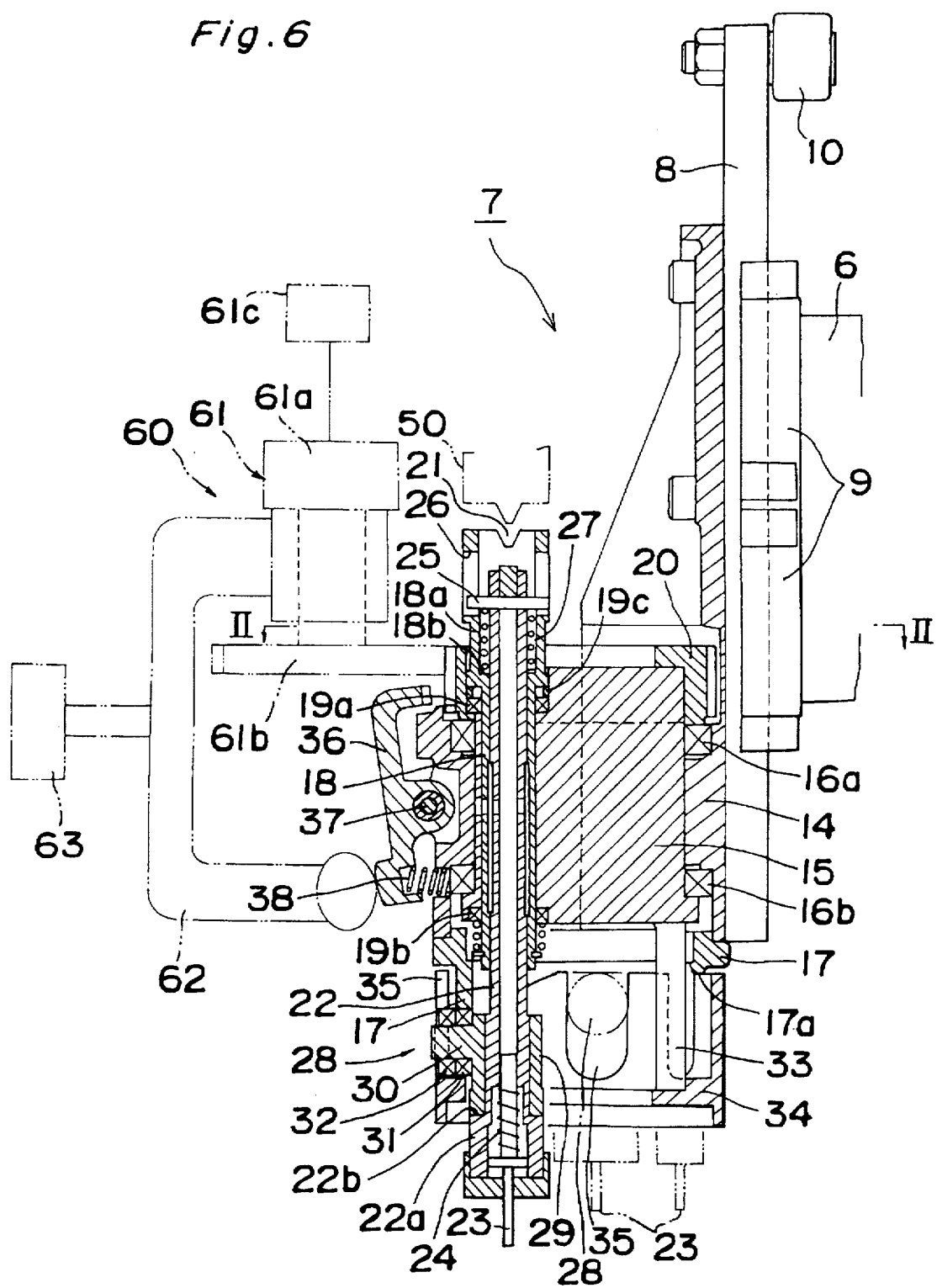
FIG. 6 is a view showing a state when a nozzle selection device of FIG. 1 is arranged at a first position.

Each of the cam followers 30 has a first roller 31 to be brought into contact with and rotate on the cam surface 17a of the cam 17 and a second roller 32 arranged outside of the roller 31. Each of the outer second rollers 32 is inserted into and brought into contact with each of longitudinal guide grooves 35. Each guide groove 35 is formed in a side surface of a guide cylindrical body 34 fixed to a strut 33 extending straight downward from a lower end of the rotary body 15. Accordingly, the guide cylindrical body 34 is rotated with the rotary body 15. Each guide groove 35 is formed in correspondence with each nozzle shaft 22 so as to guide up-and-down movements of each nozzle shaft 22 by moving and rotating each second roller 32 in each guide groove 35. The cam followers 30 are rotated integrally with the rotary body 15 about its axis and prevented from rotating about the axis of the outer cylinder 18. As shown in FIG. 5, as a different embodiment of the present invention, each of the cam followers 30 may be formed with a single roller 55 without using two rollers, i.e., the first roller 31 and the second roller 32. In this embodiment, the single roller 55 rotates and moves on the cam surface 17a of the cam 17 while the single roller 55 moves and rotates in each guide groove 35.

An engaging hook 36 to be engageable with and disengageable from the gear 20 is placed at a suitable position of an outer peripheral surface of the head main body 14. The engaging hook 36 can swing about a horizontal supporting shaft 37. A spring 38 urges the engaging hook 36 to an engaging position where an end of the engaging hook 36 engages the gear 20 thereby to prevent the rotary body 15 from rotating. The engaging hook 36 swings to a disengaging position where the end of the engaging hook 36 disengages from the gear 20 to thereby allow the rotary body 15 to rotate. The rotation of the rotary body 15 is regulated in this manner, although it can be freed.

In the above-described constitution, during the intermittent rotation of the rotary frame 6 by the driving device 2, an optional one of the mounting heads 7 is stopped at a station before each mounting head 7 is moved to the component feeding station 12. At the station, one of the suction nozzles 23 is selected for suctioning the component with a nozzle selection device 60. The nozzle selection device 60 locates only one nozzle shaft 22 at the operating position through the rotation of the rotary body. The device 60 is equipped with a driving device 61 for rotating the rotary body 15 so as to select a target suction nozzle 23 of the optional mounting head 7, a U-shaped engagement releasing member 62 secured to the driving device 61 for swinging the engaging hook 36 about the supporting shaft 37 to release the engagement of the engaging hook 36 from the rotary body 15, and a moving device 63 for moving the driving device 61 and the engagement releasing member 62 between a second position of FIG. 1 and a first position of FIG. 6. The driving device 61 has a motor 61a and a gear 61b driven by the motor 61a. The moving device 63 may be a piston driven, e.g., by air to move the releasing member 62 forward and backward. When the selection device 60 is moved to the second position by the moving device 63, as indicated in FIG. 1, the gear 61b is not engaged with the gear 20 of the rotary body 15, nor dues the engagement releasing member 62 butt against the engaging hook 36. Thus, the rotary body 15 cannot rotate. On the other hand, when the selection device 60 is moved to the first position by the moving device 63, as in FIG. 6, the gear 61b is brought into engagement with the gear 20 of the rotary body 15, and at the same time the engagement releasing member 62 presses a lower end of the engaging hook 36, whereby the engaging hook 36 swings about the supporting shaft 37 to thereby be released from the engagement with the gear 20. That is, the rotary body 15 can be rotated by the motor 61a via the gear 61b when the selection device 60 is at the first position. If it is necessary to change the suction nozzle 23 at this time, the motor 61a is controlled by a controller 61c electrically connected thereto so that a desired suction nozzle 23, namely the target suction nozzle 23, is arranged at the operating position 75. In consequence, each of the nozzle shafts 22 is rotated around the axis of the rotary body 15 via each of the outer cylinders 18 and lowered sequentially at the operating position 75 owing to the contact between the engaging device 28 at the lower end of the nozzle shaft 22 and the cam surface 17a of the cam 17. As the nozzle shaft 22 with the target suction nozzle 23 projects, the driving device 61 stops rotating the rotary body 15, and then the selection device 60 is moved to the second position by the moving device 63. As a result, the engaging hook 36 is freed from the pressure and then engaged with the gear 20 owing to the urging force of the spring 38. The rotary body 15 is hence fixed so as not to rotate.

In the above state, after the rotary frame 6 is intermittently rotated and each of the mounting heads 7 is moved again to reach the component feeding station 12 one by one, each guide rod 8 is pressed downward with a predetermined amount, so that each suction nozzle 23 located at the operating position 75 suctions the component. At this time, when a lower end of the suction nozzle 23 comes in touch with the component, the suction nozzle 23 is smoothly retracted because each of the suction nozzles 23 is urged by the spring 24 to freely retract. Accordingly, shocks during suction are eliminated and the component can be surely suctioned.

Each of the mounting heads 7 suctioning the component is moved again by the intermittent rotation of the rotary frame 6. When each of the mounting heads 7 is stopped at a station preceding the component mounting station 13 where the rotary device 50 is disposed, if it is necessary to correct a position of the suctioned component around the axis of the outer cylinder 18, the rotary device 50 is engaged with the engaging part 21 at the upper end of the outer cylinder 18 to rotate the outer cylinder 18 about the axis thereof, thereby rotating the suction nozzle 23 via the engaging groove 26, engaging pin 25, and nozzle shaft 22. The posture of the suctioned component is thus adjusted about the axis of outer cylinder 18. When the component is turned to the a target rotating posture, the rotary device 50 is stopped and disengaged from the engaging part 21. The rotating posture of the component is maintained became the nozzle shaft 22 is engaged with the cylindrical body 29, such that the nozzle shaft 22 is not rotated, so long as no more than a fixed amount of external force acts on to the cylindrical body 29.

Thereafter, when each of the mounting heads 7 is moved to the component mounting station 13 in the intermittent rotation of the rotary frame 6, each of the guide rods 8 is pressed down a predetermined amount, whereby the component is pressed to a circuit board, etc. As the suction of the component is released, the component is mounted at the circuit board. The suction nozzle 23 retracts against the urging force of the spring 24 at this time as well, and the mounting shocks are eliminated.

The aforementioned operation is repeatedly carried out sequentially for every mounting head 7 set in the rotary frame 6. In this manner, the component is suctioned at the component feeding station 12 by the suction nozzle 23 of the optimum kind selected by the operation of the nozzle selection device 60 and the rotating posture of the component is adjusted before being mounted at the component mounting station 13.

In the foregoing embodiment, all of the mounting heads 7 are moved up and down by a predetermined amount by the grooved cam 11. However, each of the mounting heads 7 may be set at the same height. Although the first roller 31 of the cam follower 30 is brought into contact with the cam surface 17a of the cam 17 in the above embodiment, a pin or a ring instead of the first roller 31 may be brought into contact with the cam surface 17a of the cam 17. Moreover, although the mounting heads 7 are set in the rotary frame 6 in the above embodiment, the mounting heads 7 may be set to a mounting head section moving along an optional route such as a linear reciprocation route, etc. without rotating the mounting heads 7.

Figure 7:
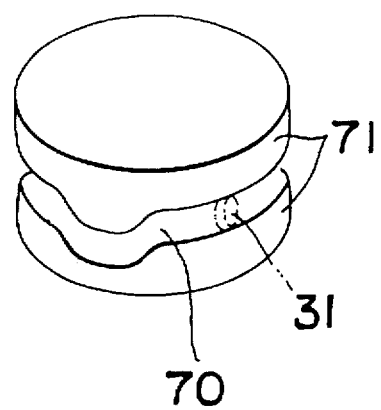
FIG. 7 is a view of a device of FIG. 1 according to a different embodiment for moving a nozzle shaft up and down.
Figure 8:
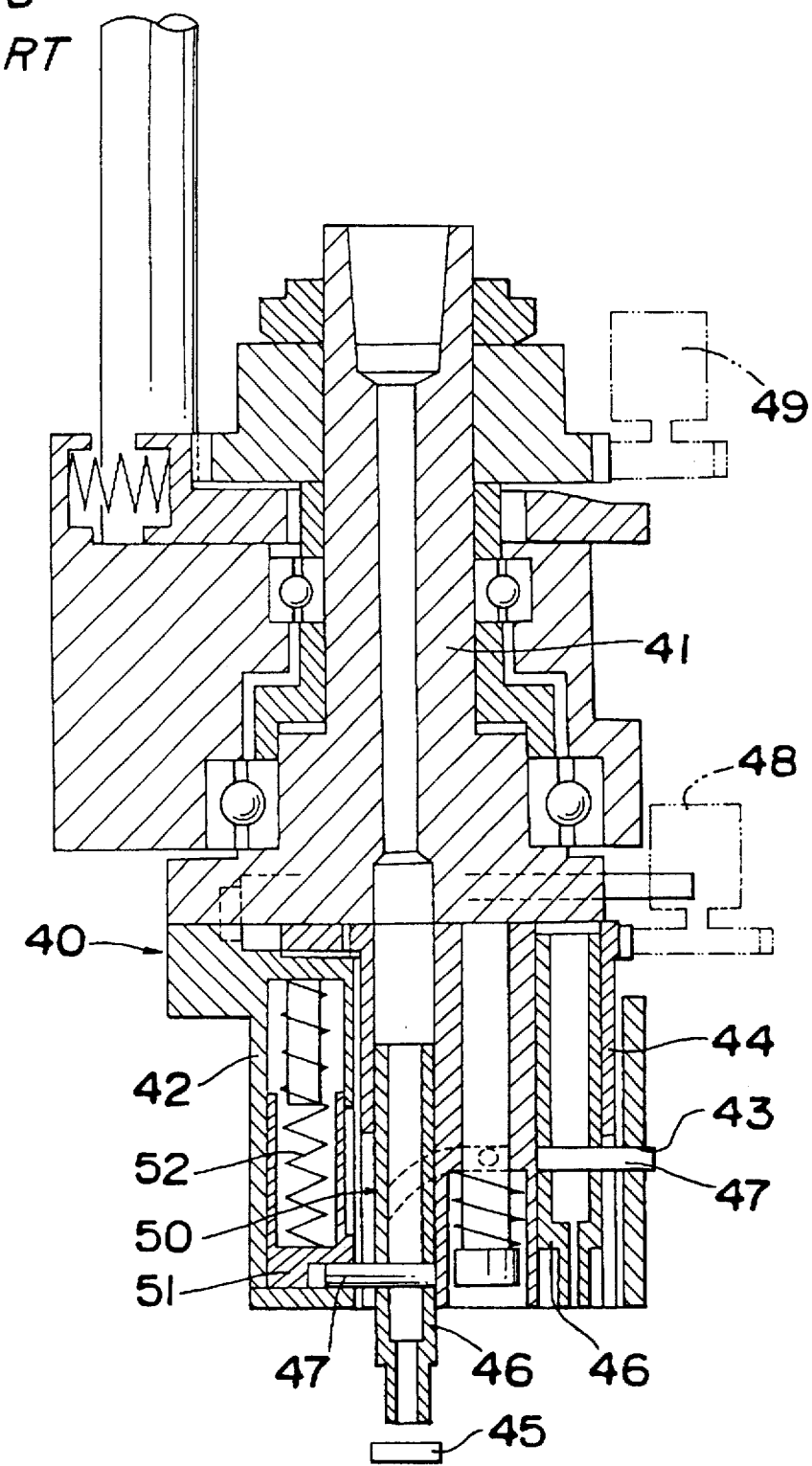
FIG. 8 is a longitudinal sectional view of a mounting head in a conventional component mounting apparatus.

In the present embodiment, the first roller 31 of the engaging device 28 is pressed to the cam surface 17a of the cam 17 by the upward urging of the nozzle shaft 22 by means of the spring 27. Alternatively, in a different embodiment of the present invention, without using the urging member utilizing the spring, a cylindrical cam member 71 having a cam groove 70 to be engaged with the first roller 31 may be formed in the upper or lower part of the rotary body 15, as illustrated in FIG. 7. Since the first roller 31 is always movably fitted into the cam groove 70, it is unnecessary to use the urging member.

As is made clear from the description of the component mounting apparatus, each of the nozzle shafts is rotated around the axis of the rotary body when the rotary body is rotated, and the engaging device provided at the lower part of each nozzle shaft is engaged with the cam, so that each nozzle shaft is pushed downward one by one at a predetermined position. In the predetermined position, the optional suction nozzle set at the lower end of each nozzle shaft is projected more downward than the other suction nozzle(s), and accordingly can be selected through the rotation of the rotary body. If the position in the direction of rotation of the component suctioned by the suction nozzle is required to be corrected, the rotary device is engaged with the engaging part at the upper end of the outer cylinder which is in turn rotated about the axis thereof, whereby the suction nozzle is rotated via the nozzle shaft. Accordingly, the position of the component is corrected only by rotating the outer cylinder, nozzle shaft, and suction nozzle. In other words, as the weight of the outer cylinder, nozzle shaft, and suction nozzle is light, the position of the component can be corrected at high speed.

The engaging device is constituted by the cam follower projecting at one side of the cylindrical body outfitted with each of the nozzle shafts, and each cam follower is comprised of the first roller to be engaged with the cam and the second roller to be engaged with the guide groove rotating integrally with the rotary body. The engagement between the second roller and guide groove can prevent an external force caused by the engagement between the first roller and the cam from rotating the nozzle shaft 22 about its axis. Thus, the suction nozzle is stably moved up and down with a high positional accuracy of the rotary position of the nozzle shaft about its being secured.

Further, since each suction nozzle is set at the lower end of each nozzle shaft in a manner to be movable up and down and urged and projected elastically by the urging member, when the optional suction nozzle is selected as described above, the suction nozzle can be smoothly retracted during suctioning or mounting of a component, which is effective to absorb shock.

Although the present invention has been fully described in connection with preferred embodiments thereof and with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus in which a mounting head having a plurality of suction nozzles for suctioning components is connectable with a moving body that is movable between a component feeding station and a component mounting station, said component mounting apparatus comprising:

a rotary body having a periphery and an axis and being fitted in the mounting head so as be rotatable about the axis, said rotary body further having an operating position at which one of said suction nozzles is located when operated to suction a component or mount a suctioned component on a board;

a cam fixed to the mounting head comprising an annular cam surface that is arranged along the periphery of the rotary body so that said cam does not rotate with said rotary body;

nozzle shafts arranged along the periphery of said rotary body, said nozzle shafts having respective lower ends, and said nozzle shafts having respective said suction nozzles at said respective lower ends;

outer cylinders having respective said nozzle shafts located therein such that said nozzle shafts are freely movable in an up and down direction in said outer cylinders, said outer cylinders being disposed along the periphery of said rotary body such that said outer cylinders are elongate in the axial direction of said rotary body, and each of said outer cylinders having an engaging part at an upper end thereof adapted to be engaged with a rotary device for rotating each of said outer cylinders; and engaging devices on respective said nozzle shafts that are rotatable with respect to said nozzle shafts and that contact with said cam surface of said cam so as to be capable of moving said nozzle shafts in correspondence with said cam surface based on rotation of said rotary body;

wherein when only one of said nozzle shafts is located at the operating position of said rotary body in accordance with rotation of said rotary body, the one of said suction nozzles of the one of said nozzle shafts is used for suctioning a component or mounting a suctioned component on a board.

2. The component mounting apparatus of claim 1, wherein said cam is arranged below said rotary body.

3. The component mounting apparatus of claim 2, and further comprising a contact device allowing each engaging device to contact said cam surface of said cam.

4. The component mounting apparatus of claim 3, wherein each of said engaging devices comprises a cam follower projecting at one side of a cylindrical body, each said cylindrical body being provided with a respective one of said nozzle shafts such that each said cylindrical body is relatively rotatable to the respective one of said nozzle shafts, and said cam follower comprising a roller to be contacted with said cam surface of said cam, wherein a guide member is connected to said rotary body and has a guide groove therein corresponding to each of said nozzle shafts, and wherein said roller is adapted to contact said guide groove of said guide member such that said guide member can guide up and down movements of each of said nozzle shafts.

5. The component mounting apparatus of claim 4, wherein said roller comprises a first roller to be contacted with said cam surface of said cam and a second roller to be contacted with said guide groove of said guide member.

6. The component mounting apparatus of claim 5, wherein each of said nozzle shafts has an axis, each of said suction nozzles is movable in a direction of the axis of the respective said nozzle shafts in the respective said nozzle shafts, and wherein said apparatus further comprises an urging member located at a lower end of each of said nozzle shafts so as to urge the respective said suction nozzles in a direction to be projected from the respective said nozzle shafts.

7. The component mounting apparatus of claim 6, wherein said cam surface of said cam is designed such that only one of said nozzle shafts can be lowered to a position where the suction nozzle is prepared to suction a component at the operating position.

8. The component mounting apparatus of claim 7, and further comprising:

a driving device for rotating said rotary body about the axis thereof; and an engaging hook attached to said mounting head having a first position in which said engaging hook is engaged with said rotary body so as to prohibit said rotary body from being rotated by said driving device and a second position in which said engaging hook is disengaged from said rotary body to allow said rotary body to be rotated by said driving device.

9. The component mounting apparatus of claim 8, wherein said rotary body comprises a gear along the periphery thereof, said driving device being movable between a first position in which said hook is not engaged with said gear to thereby rotate said rotary body and a second position in which said hook is engaged with said gear and said rotary body is not rotated, said apparatus further comprising:

a nozzle selection device for locating only one of said nozzle shafts at the operating position through the rotation of said rotary body, said nozzle selection device comprising an engagement releasing member movable between the first position and the second position for disengaging said engaging hook from said gear when moved to said first position, and a moving device for moving said driving device and said engagement releasing member between said first position and said second position.

10. The component mounting apparatus of claim 1 and further comprising a contact device allowing each engaging device to contact said cam surface of said cam.

11. The component mounting apparatus of claim 1, wherein each of said engaging devices comprises a cam follower projecting at one side of a cylindrical body, each said cylindrical body being provided with a respective one of said nozzle shafts such that each said cylindrical body is relatively rotatable to the respective one of said nozzle shafts, and said cam follower comprising a roller to be contacted with said cam surface of said cam, wherein a guide member is connected to said rotary body and has a guide groove therein corresponding to each of said nozzle shafts, and wherein said roller is adapted to contact said guide groove of said guide member such that said guide member can guide up and down movements of each of said nozzle shafts.

12. The component mounting apparatus of claim 11, wherein said roller comprises a first roller to be contacted with said cam surface of said cam and a second roller to be contacted with said guide groove of said guide member.

13. The component mounting apparatus of claim 11, wherein said cam surface of said cam is designed such that only one of said nozzle shafts can be lowered to a position where the suction nozzle is prepared to suction a component at the operating position.

14. The component mounting apparatus of claim 1, wherein each of said nozzle shafts has an axis, each of said suction nozzles is movable in a direction of the axis of the respective said nozzle shafts in the respective said nozzle shafts, and wherein said apparatus further comprises an urging member located at a lower end of each of said nozzle shafts so as to urge the respective said suction nozzles in a direction to be projected from the respective said nozzle shafts.

15. The component mounting apparatus of claim 14, wherein said cam surface of said cam is designed such that only one of said nozzle shafts can be lowered to a position where the suction nozzle is prepared to suction a component at the operating position.

16. The component mounting apparatus of claim 1, wherein said cam surface of said cam is designed such that only one of said nozzle shafts can be lowered to a position where the suction nozzle is prepared to suction a component at the operating position.

17. The component mounting apparatus of claim 1, and further comprising:

a driving device for rotating said rotary body about the axis thereof; and an engaging hook attached to said mounting head having one position in which said engaging hook is engaged with said rotary body so as to prohibit said rotary body from being rotated by said driving device and another position in which said engaging hook is disengaged from said rotary body to allow said rotary body to be rotated by said driving device.

18. A component mounting method for mounting a component on a board with a component mounting apparatus in which a mounting head having a plurality of suction nozzles for suctioning components is connectable with a moving body that is movable between a component feeding station and a component mounting station, the component mounting apparatus comprising:

a rotary body having a periphery and an axis and being fitted in the mounting head so as be rotatable about the axis, the rotary body further having an operating position at which one of the suction nozzles is located when operated to suction a component or mount a suctioned component on a board, a cam fixed to the mounting head comprising an annular cam surface that is arranged along the periphery of the rotary body so that the cam does not rotate with the rotary body, nozzle shafts arranged along the periphery of the rotary body, the nozzle shafts having respective lower ends, and the nozzle shafts having the respective suction nozzles at the respective lower ends, outer cylinders having respective said shafts located therein such that the nozzle shafts are freely movable in an up and down direction in the outer cylinders, the outer cylinders being disposed along the periphery of the rotary body such that the outer cylinders are elongate in the axial direction of the rotary body, and each of the outer cylinders having an engaging part at an upper end thereof adapted to be engaged with a rotary device for rotating each of the outer cylinders, and engaging devices on the respective nozzle shafts that are rotatable with respect to the nozzle shafts and that contact with the cam surface of the cam so as to be capable of moving the nozzle shafts in correspondence with the cam surface, wherein when only one of the nozzle shafts is located at the operating position of the rotary body in accordance with rotation of the rotary body, the one of the suction nozzles of the one of the nozzle shafts is used for suctioning a component or mounting a suctioned component on a board, and wherein the cam surface of the cam is designed to lower only one of the nozzle shafts to a position where the suction nozzle is prepared for a suction operation at the operating position of the suction nozzle, said method comprising:

rotating the rotary body, thereby:

locating the only one of the nozzle shafts at the operating position and thus lowering the only one of the nozzle shafts from the rotary body with the rest of the nozzle shafts not being lowered, and moving the mounting head downward at the component feeding station;

suctioning the component with the suction nozzle of the lowered nozzle shaft; and mounting the component suctioned with the suction nozzle of the lowered nozzle shaft on the board at the component mounting station.

19. The method of claim 18, and further comprising:

correcting a position of a component suctioned by the suction nozzle of the lowered nozzle shaft by rotating the suction nozzle through rotation of the outer cylinder having the suction nozzle of the lowered nozzle shaft;

wherein said correcting is executed between said suctioning and said mounting, and wherein said mounting comprises the component mounting apparatus mounting the suctioned and positionally corrected component on the board at the component mounting station.

* * * * *